United States Patent
Miyahara

[11] Patent Number: 6,141,218
[45] Date of Patent: Oct. 31, 2000

[54] COOLING DEVICE FOR ELECTRONIC APPARATUS

[75] Inventor: Masaharu Miyahara, Oita, Japan

[73] Assignee: Matsushita Electric Industrial Co., Ltd., Osaka, Japan

[21] Appl. No.: 09/229,311

[22] Filed: Jan. 13, 1999

[30] Foreign Application Priority Data

Jan. 22, 1998 [JP] Japan ................................. 10-010206

[51] Int. Cl.⁷ ............................................. H05K 7/20
[52] U.S. Cl. ..................... 361/695; 361/687; 361/692; 361/717; 361/719; 165/104.33; 165/122; 415/176
[58] Field of Search ........................... 361/683, 685, 361/687, 695, 694, 697, 715, 719, 690, 688, 722, 730, 752, 707–709, 699; 165/80.3, 122, 185, 121; 415/213.1, 214.1, 175–178, 211.1; 310/67 R, 90, 91, 217, 62, 63, 257, 42, 9, 915.6; 417/313, 360, 572, 83, 78, 423.13, 423.7, 423.12

[56] References Cited

U.S. PATENT DOCUMENTS

| | | | |
|---|---|---|---|
| 4,783,608 | 11/1988 | Gruber | 310/90 |
| 5,020,138 | 5/1991 | Yasuda et al. | 455/128 |
| 5,288,961 | 2/1994 | Shibuya et al. | 219/702 |
| 5,343,104 | 8/1994 | Takahashi et al. | 310/90 |
| 5,363,003 | 11/1994 | Harada et al. | 310/67 R |
| 5,478,221 | 12/1995 | Laya | 417/313 |
| 5,502,618 | 3/1996 | Chiou | 361/695 |
| 5,731,953 | 3/1998 | Sakurai | 361/695 |
| 5,810,554 | 9/1998 | Yokozawa et al. | 415/176 |

FOREIGN PATENT DOCUMENTS

| | | | |
|---|---|---|---|
| 7-111302 | 4/1995 | Japan | H01L 23/467 |
| 408274481 | 10/1996 | Japan | H05K 7/20 |

*Primary Examiner*—Leo P. Picard
*Assistant Examiner*—Michael Datskovsky
*Attorney, Agent, or Firm*—Wenderoth, Lind & Ponack, L.L.P.

[57] ABSTRACT

A cooling device comprises a) a housing with openings, b) substrates disposed in the housing, c) heat-generating components mounted on the substrates, d) a heat conductive member thermally coupled to the heat-generating-components and a frame thermally coupled to an edge of the heat conductive member, and e) a cooling fan motor accommodated in the housing and mounted on the substrate. The cooling fan motor occupies less space in the housing, and dissipates the build-up heat produced by the heat-generating components as well as cools down the components. The cooling device thus contributes to slimming and downsizing of the electronic apparatuses such as mobile personal computers and digital video cameras.

12 Claims, 3 Drawing Sheets

COOLING DEVICE FOR ELECTRONIC APPARATUS

FIELD OF THE INVENTION

The present invention relates to cooling devices employed in electronic apparatuses having slim bodies.

BACKGROUND OF THE INVENTION

In the conventional slim electronic apparatuses as shown in FIG. 3, a substrate 3 on which heat generating components 2 such as semiconductors and a CPU are mounted is disposed in a slim electronic apparatus. The heat produced by components 2 travels through heat conductive member 4 such as an aluminum plate, and is discharged outside the apparatus. The discharged heat amount is calculated with the following expression.

$$Q \text{ out } \Sigma(Tsi-Ta) \times Si$$

where:
Q out=discharged heat amount
Tsi=a temperature at an "i"th cell of the housing surface, which is finely divided into cells
Si=an area of the "i"th cell
Ta=outer temperature Accordingly, the housing temperature rises and an area of high temperature increases at greater build-up heat amounts produced by the components.

When this structure is employed in an electronic apparatus such as a mobile computer or a digital video camera, the interior build-up heat could potentially damage its internal electronic operating components. Further, since these apparatus are held in a user's hand during operation, the temperature rise on the housing surface makes the user uncomfortable. Therefore, it has been proposed to discharge the interior build-up heat forcibly outside the apparatus by providing a cooling fan in the apparatus.

FIG. 4 shows another electronic apparatus with a conventional cooling fan. In FIG. 4, substrate 3 accommodating heat generating components 2 such as semiconductors is mounted in housing 1. Substrate 3 mounted at the bottom of housing 1 is shortened at its end in order to provide a space between substrate 3 and a side of the housing. In this space, flat cooling-fan 5 is disposed so that its shortest side extends in the height direction of the apparatus. The heat produced by components 2 travels to fan 5 via heat conductive member 4 made of e.g. aluminum or copper. Then fan 5 forcibly discharges the heat outside the apparatus.

The structure shown in FIG. 4 is employed in a large number of slim notebook-type personal computers. In addition to ensuring reliability of the personal computers, it is desirable that the height of cooling fan 5 be as low as ca. 7.5 mm so that the total housing height thereof should be less than 20 mm.

However, this structure shown in FIG. 4 still has the following problem. Two sheets of double sided substrates accommodate the components. Each substrate measures 50 mm×100 mm. The total component mounting area is thus 50 mm×100 mm×2 sides×2 sheets=20000 m$^2$.

In order to place fan 5 that measures 40 mm×40 mm, substrate 3 should be cut out, which reduces the component mounting area by 40 mm×40 mm×2 sides=3200 mm$^2$. As a result, the total component mounting area is reduced by 16%.

This area reduction decreases the number of components which can to be mounted, and has been an obstacle to realizing compact size electronic apparatus having high performance and versatile functions.

SUMMARY OF THE INVENTION

The present invention addresses the problems discussed above and aims to provide a compact and high-performance cooling device for electronic apparatuses requiring a cooling fan and a fan motor that can minimize a reduction of the component mounting area so that apparatuses can be thinner in size.

A cooling device of an electronic apparatus of the present invention comprises the element below:

(a) a housing having openings;
(b) substrates installed in the housing;
(c) heat generating components mounted on the substrates;
(d) a heat-conductive member thermally coupled to the heat generating components;
(e) a frame thermally coupled to an edge of the heat-conductive member; and
(f) a cooling fan motor housed by the frame and disposed on one of the substrates.

To be more specific, a flat cooling-fan-motor is employed and a bearing section extending toward lower than the motor is provided. A bearing boss of the bearing section fixes the motor section to the substrate so that the entire motor section or a rotor is lifted off the substrate. The heat-generating component on the substrate is coupled to the frame of the cooling fan motor the with heat-conductive member.

This structure allows the cooling fan motor to be mounted on part of the substrate while the remaining part of the substrate, except the place occupied by motor mounting related components e.g. bearing boss, can accommodate components. This structure can thus place the cooling fan motor at an effective location in the housing with less reduction of the component mounting area on the substrate. As a result, this structure realizes a compact electronic apparatus having high performance and versatile functions.

DESCRIPTION OF THE PREFERRED EMBODIMENTS

An exemplary embodiment of the present invention is described hereinafter with reference to the accompanying drawings.

Figure 1:
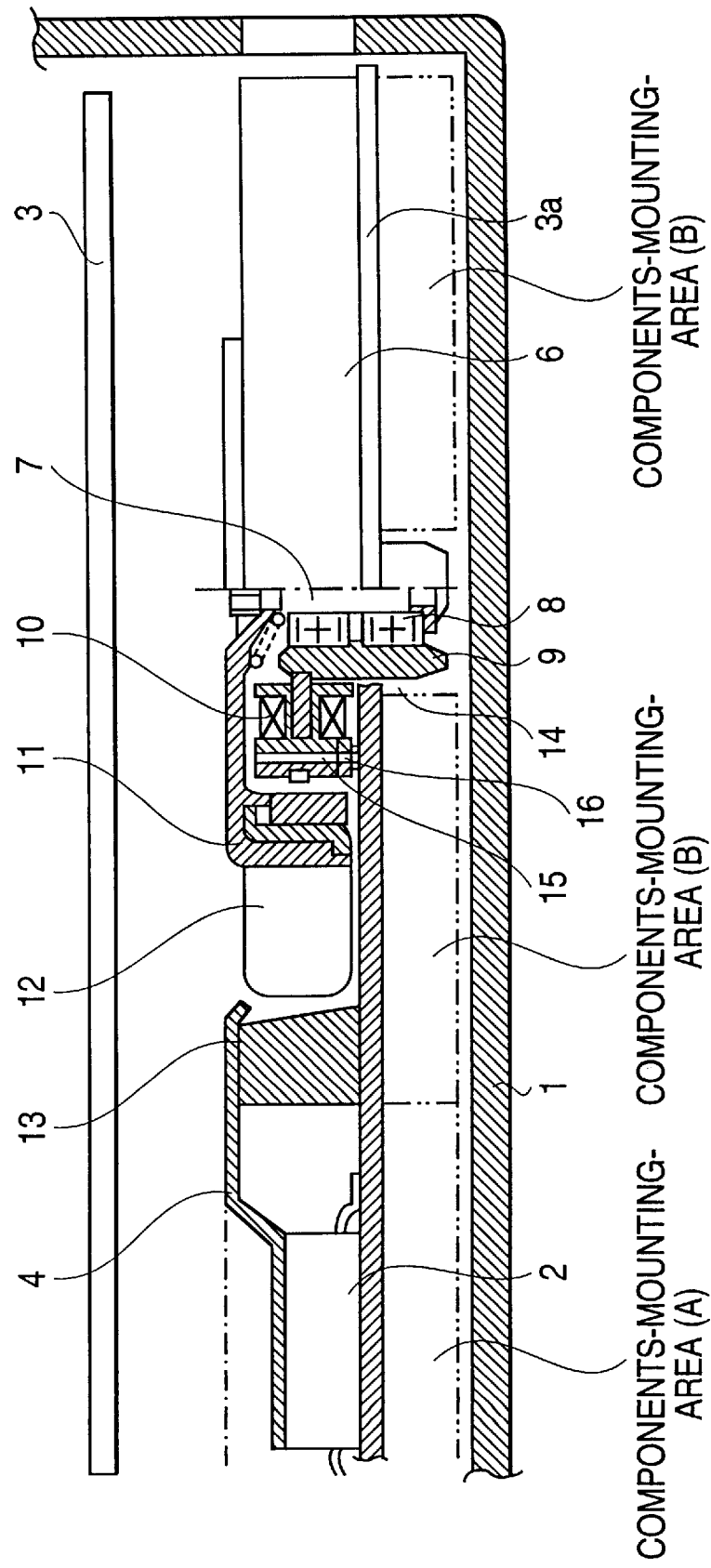
FIG. 1 is a cross section of an essential part of a cooling device employed in an electronic apparatus in accordance with a first exemplary embodiment of the present invention.
Figure 2:
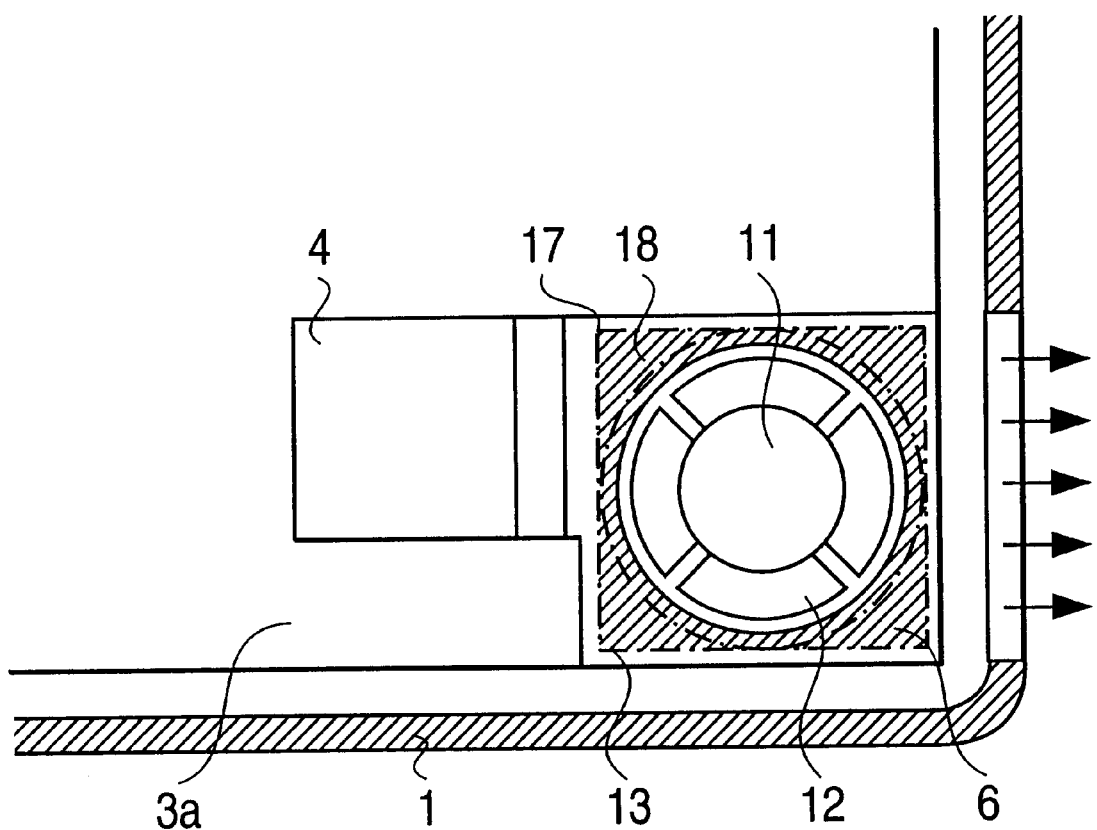
FIG. 2 is a plan view of an essential part of a cooling device employed in an electronic apparatus in accordance with the first exemplary embodiment of the present invention.
Figure 3:
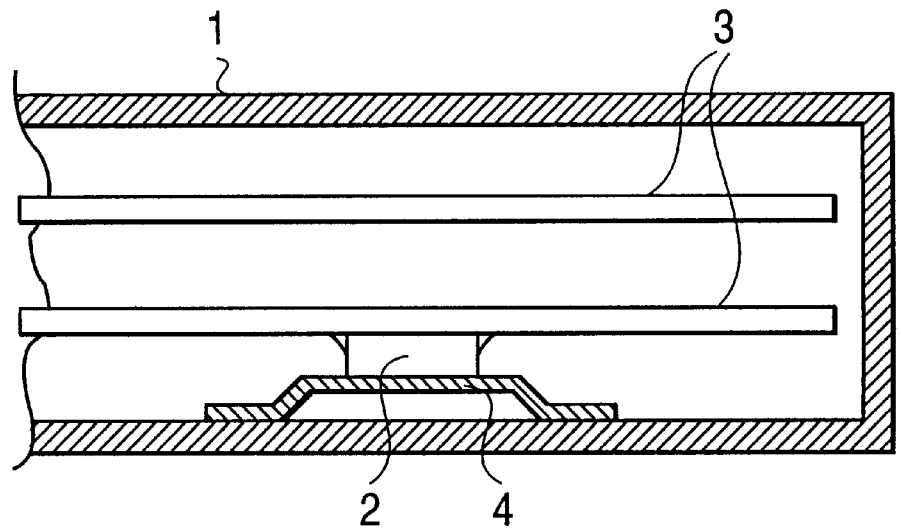
FIG. 3 is a cross section of a cooling device of a conventional electronic apparatus.
Figure 4:
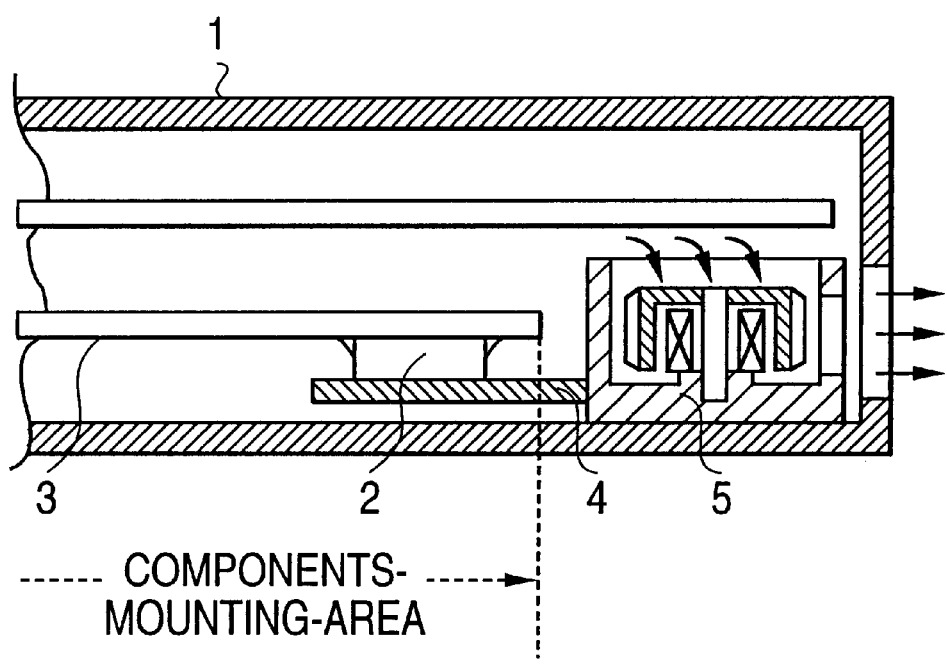
FIG. 4 is a cross section of a cooling device of another conventional electronic apparatus.

FIG. 1 and FIG. 2 depict the structures in accordance with the exemplary embodiment. The elements that are the same as used in the prior art are marked with the same symbols.

In FIG. 1 and FIG. 2, a plurality of substrates 3 and 3a are installed in a multistory manner in a slim housing 1 of an electronic apparatus. These substrates accommodate electronic components, functional components and the like.

Among these substrates, substrate 3a placed at the lowest story in the height direction of housing 1 accommodates heat-generating components 2 such as semiconductors. A flat cooling-fan-motor 6 is placed on substrate 3a near its edge.

The motor section comprises a) rotary shaft 7, b) bearing 8 supporting rotary shaft 7, c) bearing boss 9 of which one part extends downward to below substrate 3a, d) stator 10 having a bobbin fixed around boss 9 and field wiring, and e) outer rotor 11 having a cap member coupled to rotary shaft 7 and permanent magnets.

The fan of cooling-fan motor 6 has a plurality of blades 12 protruding outward from the rim of rotor 11. A frame 13 of motor 6 is made of conductive material such as aluminum, copper or magnesium alloy, and is shaped into a frame enclosing the fan with an opening on the upper face for air intake. At least one of the side faces of frame 13 has an opening for air discharge. The cooling device comprises these elements and is shaped in a flat body.

The bottom face of frame 13 is glued to substrate 3a with adhesive or the like, and bearing boss 9 is press-fitted into a mounting hole 14 of substrate 3a so that stator 10 and rotor 11 are lifted off the upper face of substrate 3a. Cooling fan motor 6 is thus fixed on substrate 3a. A plate type of heat conductive member 4 coupled to heat-generating components 2 is thermally coupled to the upper face of frame 13.

Heat conductive member 4 is made of a highly heat-conductive material such as aluminum, copper, iron, brass, magnesium alloy and other metallic members. A highly flexible material such as graphite, among others, is good for this application because graphite can be wired rather arbitrarily. A portion of heat conductive member 4 overhangs from the upper face of frame 13. The overhung portion is bent toward frame 13 and downwardly tapered so that a bell-mouth is formed at the opening of frame 13.

A fixing hole 15 is formed on the bobbin at its substrates 3a side. Fixing pin 16 is extended from the spot on the upper face of substrate 3a corresponding to fixing hole 15. Pin 16 is inserted into hole 15 so that stator 10 is securely fixed and accurately positioned on substrate 3a.

Bearing boss 9 is press-fitted into mounting hole 14 of substrate 3a, and fixing pin 16 is inserted into fixing hole 15 of stator 10, whereby an active depth of boss 9 can be regulated, the motor section can be prevented from being shifted, and the motor position can be regulated.

The fixing hole and pin can be provided on substrate 3a and stator 10, respectively. A brim is mounted on the rim of bearing boss 9 so that the active depth of boss 9 is regulated. At the same time, a rib can be provided on the rim of boss 9 along the axial direction of rotary shaft 7 so that motor section can be blocked from being shifted. Mounting pins can be provided on the bottom face of frame 13, and holes corresponding to these pins are provided on substrate 3a. The pins are inserted into the holes so that frame 13 can be fixed to substrate 3a.

Frame 13 is shaped as a rectangular frame, and the inside corners thereof have spaces 17 allowing for the outside of the locus drawn by the outer edges of blades 12. Space 17 accommodates motor driving circuit 18.

The structure discussed above allows the heat generated by activated components 2 to travel to frame 13 via heat conductive member 4. The airflow produced by spinning blades 12 hits frame 13, whereby heat exchange is effected between frame 13 and the airflow. Then the heated air is discharged outside of housing 1 through the air discharge opening of frame 13. This operation cools down the components 2, to thereby prevent the temperature of housing 1 from rising. Cooling fan motor 6 draws air efficiently thanks to the bell-mouth opening formed by the overhung edge of heat conductive member 4 so that efficient heat exchange is effected.

Cooling fan motor 6 used in this exemplary embodiment is a flat type with a lower height in the thickness direction of housing 1 so that motor 6 can be employed in a slim electronic apparatus. The width of motor 6 is therefore greater; and yet, the motor section is lifted off substrate 3a by using bearing boss 9 so that the rotor can spin free from obstacles and substrate 3a can be free from being shortened. Since substrate 3a accommodates various components over its entire face except the place corresponding to bearing boss 9 of substrate 3a, the component-mounting-area can avoid being substantially decreased. In other words, as depicted in FIG. 1, this exemplary embodiment has component mounting area B in addition to conventional area A, which allows more components to be mounted without enlarging housing 1. As a result, an electronic apparatus having a cooling device, high performance and versatile functions can be realized.

Frame 13 is shaped into a rectangular frame of which corner space 17 can accommodate motor driving circuit 18, which can thus save the space that would otherwise be occupied by circuit 18 on substrate 3a outside of the cooling fan motor or at other places. As a result of saving this reserved space for circuit 18, the electronic apparatus can be further slimmed and downsized.

In this exemplary embodiment, the outer rotor is employed in the motor section. A flat motor comprising a flat stator and flat rotor placed thereabove and face toward can substitute for the outer-rotor motor. In this case, the flat stator is incorporated in a substrate, and only the flat rotor can be lifted off the substrate.

A fluid dynamic-pressure bearing can be formed between rotary shaft 7 and bearing 8 so that the motor section produces lower noise.

Rectangular frame 13 in this exemplary embodiment can be a circular frame when the motor driving circuit is disposed outside of the cooling fan motor. Heat conductive member 4 can be formed by an extension of part of frame 13, or by utilizing part of a frame-cover.

A plurality of air discharge openings can be provided, and other components may be subjected to the discharged airflow to be cooled down.

The cooling device of the present invention, as discussed above, occupies less space for its cooling fan motor in the housing, dissipates the interior build-up heat produced by the heat-generating components and cools down the components. As a result, the cooling device can be used to realize a compact and slim electronic apparatus such as a mobile personal computer or a digital video camera. Great industrial advantages can thus be expected from this invention.

What is claimed is:

1. A cooling device for an electronic apparatus, comprising:
 (a) a housing having an opening;
 (b) a substrate disposed in said housing;
 (c) a heat-generating component mounted on said substrate;
 (d) a heat conductive member coupled with said heat-generating component;
 (e) a frame coupled to said heat conductive member; and
 (f) a cooling fan motor housed by said frame and mounted on said substrate;

wherein said heat conductive member overlaps an upper face of said frame, and a portion of said heat conductive member overhangs from said frame wherein the overhung portion is bent toward said frame and downwardly tapered to form an opening that goes narrower toward a bottom of said frame.

2. A cooling device for an electronic apparatus, comprising:

(a) a housing having an opening;

(b) a substrate disposed in said housing;

(c) a heat-generating component mounted on said substrate;

(d) a heat conductive member coupled with said heat-generating component;

(e) a frame coupled to said heat conductive member;

(f) a motor section disposed in said frame and having a rotary shaft;

(g) a blade mounted to said rotary shaft of said motor section; and (h) a bearing boss mounted on said substrate and supporting the rotary shaft;

wherein said heat conductive member overlaps an upper face of said frame, and a portion of said heat conductive member overhangs from said frame wherein the overhung portion is bent toward said frame and downwardly tapered to form an opening that goes narrower toward a bottom of said frame.

3. A cooling device for an electronic apparatus comprising:

(a) a housing having an opening;

(b) a substrate disposed in said housing;

(c) a heat-generating component mounted on said substrate;

(d) a heat conductive member coupled with said heat-generating component;

(e) a frame coupled to said heat conductive member and having an opening on at least one side face of said frame;

(f) a motor section disposed in said frame and having a rotary shaft;

(g) a blade mounted to said rotary shaft of said motor section; and (h) a bearing boss press-fitted to said substrate and supporting the rotary shaft;

wherein spinning said motor section allows said cooling device to draw air from the blade side, to discharge the air outside of said motor section through the opening of said frame, and to discharge the air outside the housing through the opening of said housing;

wherein said heat conductive member overlaps an upper face of said frame, and a portion of said heat conductive member overhangs from said frame wherein the overhung portion is bent toward said frame and downwardly tapered to form an opening that goes narrower toward a bottom of said frame.

4. A cooling device for an electronic apparatus, comprising:

(a) a housing having an opening;

(b) a substrate disposed in said housing;

(c) a heat-generating component mounted on said substrate;

(d) a first hole provided in said substrate;

(e) a fixing pin extending from a surface of said substrate;

(f) a heat conductive member coupled with said heat-generating component;

(g) a frame coupled to said heat conductive member;

(h) a motor section disposed in said frame and having a rotary shaft;

(i) a rotor having a rim and being mounted on said rotary shaft of said motor section;

(j) a blade mounted on said rim of said rotor;

(k) a bearing boss having a rim and supporting the rotary shaft; and (l) a stator disposed on said rim of said bearing boss and having a second hole on a surface facing said substrate;

wherein said motor section is fixed to said substrate by inserting said fixing pin into the second hole and inserting said bearing boss into said first hole; and wherein said heat conductive member overlaps an upper face of said frame, and a portion of said heat conductive member overhangs from said frame wherein the overhung portion is bent toward said frame and downwardly tapered to form an opening that goes narrower toward a bottom of said frame.

5. The cooling device of claim 1 wherein said heat conductive member comprises graphite.

6. The cooling device of claim 2 wherein said heat conductive member comprises graphite.

7. The cooling device of claim 3 wherein said heat conductive member comprises graphite.

8. The cooling device of claim 4 wherein said heat conductive member comprises graphite.

9. The cooling device of claim 1 wherein said frame is formed as a rectangular frame having a corner section which accommodates a motor driver.

10. The cooling device of claim 2 wherein said frame is formed as a rectangular frame having a corner section which accommodates a motor driver.

11. The cooling device of claim 3 wherein said frame is formed as a rectangular frame having a corner section which accommodates a motor driver.

12. The cooling device of claim 4 wherein said frame is formed as a rectangular frame having a corner section which accommodates a motor driver.

* * * * *